United States Patent [19]

Awaya

[11] Patent Number: 4,757,475
[45] Date of Patent: Jul. 12, 1988

[54] SEMICONDUCTOR MEMORY DEVICE HAVING DIODE MATRIX TYPE DECODER AND REDUNDANCY CONFIGURATION

[75] Inventor: Tomoharu Awaya, Yokohama, Japan
[73] Assignee: Fujitsu Limited, Kawasaki, Japan
[21] Appl. No.: 863,041
[22] Filed: May 14, 1986
[30] Foreign Application Priority Data
May 20, 1985 [JP] Japan .................................. 60-105902
[51] Int. Cl.⁴ ............................................. G11C 7/00
[52] U.S. Cl. ..................................... 365/200; 371/10
[58] Field of Search .................... 365/200; 371/10, 11, 371/21

[56] References Cited

U.S. PATENT DOCUMENTS 3,753,244 8/1973 Sumilas ............................... 365/200
4,583,179 4/1986 Horii et al. ....................... 365/200 X Primary Examiner—Joseph A. Popek
Attorney, Agent, or Firm—Staas & Halsey

[57] ABSTRACT

A bipolar-transistor type semiconductor memory device having a redundancy configuration includes a memory cell array, a redundancy memory cell array, and an address buffer circuit having a predetermined number of emitter-coupled logic gates which receive input address signals and have an output terminal. Each of the logic gates compares a voltage level of the corresponding input address signal with a voltage level of a reference signal. A group of first decoder lines connected to the predetermined output terminals. A comparator circuit detects whether or not each of the input address signals coincides with each of address signals corresponding to a defective circuit portion and puts a selection signal in accordance with the detection of a coincidence signal. A switching circuit compares a voltage level of the selection signal with a voltage level of a reference signal. A second decoder line is connected to a predetermined output terminal provided in the switching circuit. A predetermined number of diode groups including a predetermined number of first diodes and a second diode are provided. The conductive state of each of the first diodes is determined by a voltage level of the predetermined first decoder line, the conductive state of the second diode is determined by a voltage level of the second decoder line. Accordingly, the memory cell array is selected through the predetermined diode groups in accordance with the input address signals when the comparator circuit does not output the selection signal. Otherwise the redundancy memory cell array is selected.

3 Claims, 11 Drawing Sheets

| Fig. 3 A | Fig. 3 B |

SEMICONDUCTOR MEMORY DEVICE HAVING DIODE MATRIX TYPE DECODER AND REDUNDANCY CONFIGURATION

BACKGROUND OF THE INVENTION

1. Field of the Invention

The present invention relates to a semiconductor memory device. More particularly, it relates to a bipolar-transistor type semiconductor memory device having a diode-matrix type decoder and a redundancy circuit portion for replacing a defective circuit portion such as a defective memory cell.

2. Description of the Related Art

In a random-access memory (RAM) device, a large number of memory cells are arranged along rows and columns. The density of defects generated in such a semiconductor memory device during the manufacture thereof is relatively independent of the integration density of the device. Rather, the defects are a result of semiconductor manufacturing technology. In general, the higher the integration density of the device, the greater the ratio of normal memory cells to defective memory cells. This is one of the advantages of increasing the integration density of a semiconductor memory device. Even if a device includes only one defective memory cell, however, the device cannot be operated normally and, therefore, must be scrapped. As a result, despite the lower ratio of defective memory cells, greater integration density means reduced manufacturing yield.

In a metal-insulator-semiconductor (MIS) type RAM, in order to overcome the problem of defective memory cells, use is made of redundancy memory cells. When a defective memory cell is detected, a redundancy memory cell row or column is selected instead of the memory cell row or column including the defective memory cell. In general, one or two redundancy memory cell rows or columns are usually provided.

With improvements in integration technology for bipolar-transistor type RAMs and the requirement of larger numbers of memory cells, however, bipolar-transistor type RAM devices having a large number of memory cells have come into demand, and accordingly, this has led to a demand for bipolar-transistor type RAMs having a redundancy configuration.

Generally, in the bipolar-transistor type memory device, two kinds of memory devices are well known, i.e., one which includes a logic type decoder, and another which includes a diode matrix type decoder. Generally, the memory device including the logic type decoder has an advantage in that the response time is rapid, and as a result, the switching from a predetermined operation to a next operation is smoothly performed. However, a memory device including the above logic type decoder has a drawback in that it is necessary to provide a large number of constant current sources, especially when the capacity of the memory device is large (for example, when the capacity of the memory device is 64 kilo bits, it is necessary to provide two hundred and fifty six constant current sources, each of which is provided in a word driver unit), and thus, the power consumption increases in accordance with the increase of the number of the constant current sources. In other words, the logic type decoder is not suitable for a memory device having a large capacity.

On the other hand, the memory device having the diode matrix type decoder has an advantage in that it is possible to raise the efficiency of the current by decreasing the number of constant current sources, and thus, decrease the power consumption. In other words, the diode matrix type decoder is more suitable for a memory device having a large capacity.

Although it has been proposed to provide a redundancy configuration in a memory device including a logic type decoder, a memory device having a redundancy configuration and a diode matrix type decoder has not been provided as yet.

SUMMARY OF THE INVENTION

The present invention solves the above-mentioned problem, and the object of the present invention is to provide a semiconductor memory device having a diode matrix type decoder and a redundancy configuration by adding only a relatively simple circuit.

To attain the above object, according to the present invention, there is provided a bipolar-transistor type semiconductor memory device having a redundancy configuration, comprising a memory cell array, a redundancy memory cell array, and an address buffer circuit including a predetermined number of emitter-coupled logic gates. A predetermined number of input address signals are supplied to each of the logic gates so that each of the logic gates compares a voltage level of the corresponding input address signal with a voltage level of a reference signal. A group of first decoder lines are provided, each of the first decoder lines being connected to a predetermined output terminal provided in each of the logic gates. A comparator circuit defects whether or not each of the input address signals coincides with each of the address signals corresponding to a defective circuit portion and outputs a switching signal in accordance with the detection of a coincidence signal. A switching circuit compares a voltage level of the switching signal with a voltage level of a reference signal. A second decoder line is connected to a predetermined output terminal provided in the switching circuit. A predetermined number of diode groups is also provided, each of which comprises a predetermined number of first diodes and a second diode, the conductive state of each of the first diodes being determined by a voltage level of the predetermined first decoder line, the conductive state of the second diode being determined by a voltage level of the second decoder line. The memory cell array is selected through the predetermined diode groups in accordance with the input address signals when the comparator circuit does not output the switching signal. The redundancy memory cell array is selected through the switching circuit when the comparator circuit does output the switching signal.

Thus, according to the present invention, it is possible to provide a semiconductor memory device having a diode matrix type decoder and a redundancy configuration by adding only a relatively simple construction, and as a result, to easily improve the manufacturing yield of a memory device without losing the above-mentioned advantage obtained by the memory device having the diode matrix type decoder.

BRIEF DESCRIPTION OF THE DRAWINGS

FIG. 1 which includes

FIG. 4 which includes

FIG. 5 which includes FIG. 6 which includes

DESCRIPTION OF THE PREFERRED EMBODIMENTS

Figure 1A:
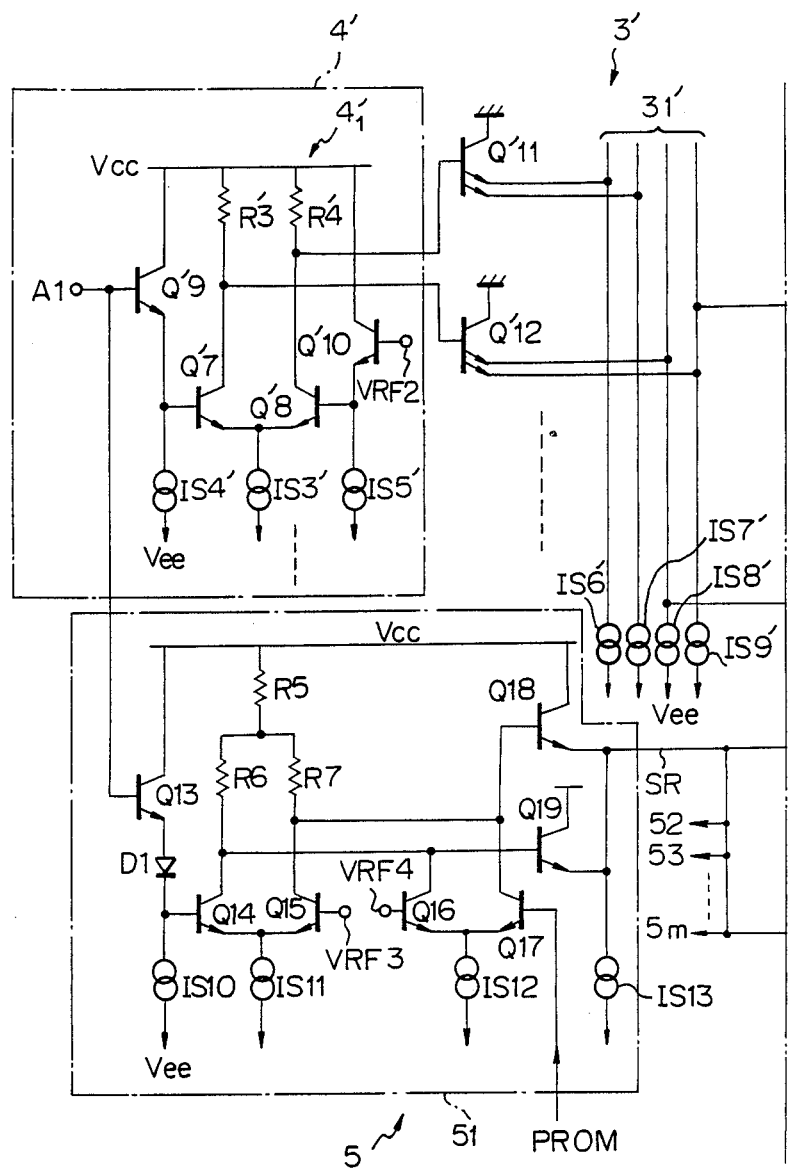
FIGS. 1A and 1B, is a circuit diagram of a semiconductor memory device having a logic type decoder and redundancy configuration.
Figure 1B:
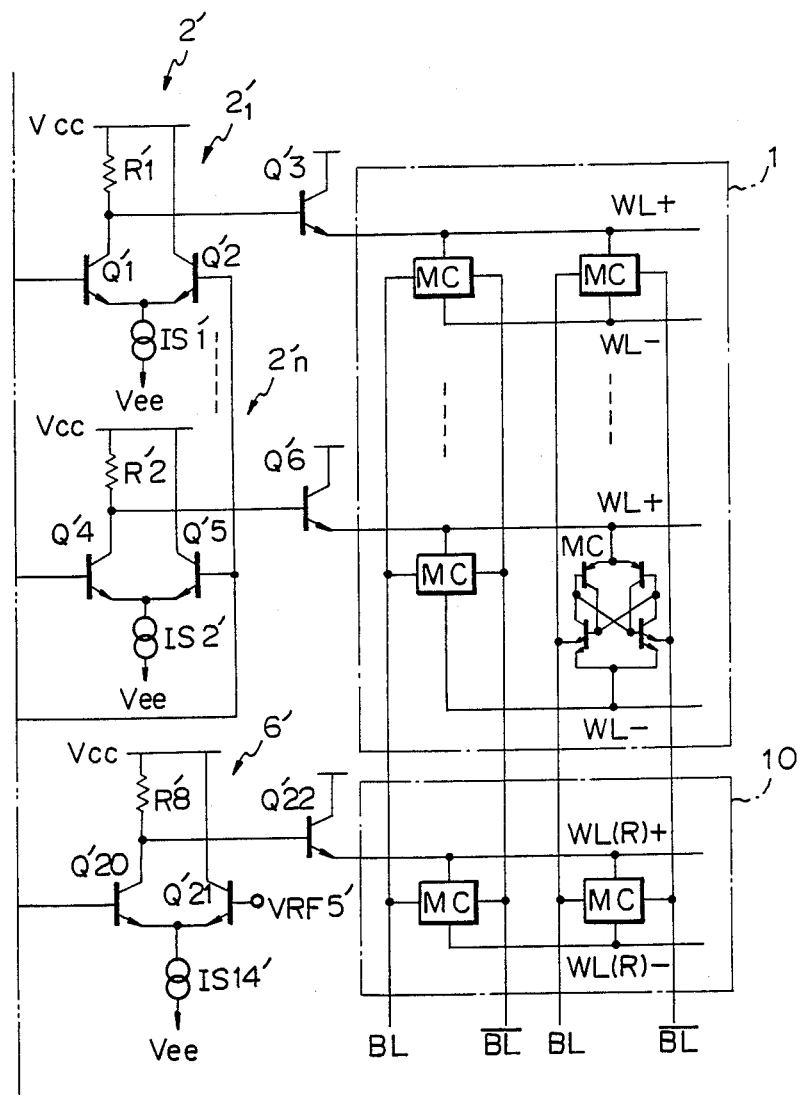

To clarify the background of the present invention, an example of a proposed memory device having a logic type decoder and redundancy configuration is shown in FIG. 1. As shown in FIG. 1, the device includes a memory cell array 1, a word driver 2', a word decoder 3', an address buffer 4' for the word address signals, a redundancy memory cell array 10, a redundancy word driver 6', and a comparator circuit 5, etc.

The memory cell array 1 includes a plurality of memory cells MC connected between a high voltage word line WL+ and a low voltage word line WL− and between bit lines BL and $\overline{BL}$. The word driver 2' includes a plurality of word driver units $2_1'$ to $2_n'$ each corresponding to a word line in the memory cell array 1. Each word driver unit is formed in the same manner. For example, the word driver unit $2_1$ includes two transistors Q1' and Q2', whose emitters are commonly connected to a constant current circuit IS1' connected between the commonly-connected emitters of these transistors and the low voltage power supply $V_{ee}$, a load resistor R1' connected between the collector of the transistor Q1' and the high voltage power supply $V_{cc}$, and a driver transistor Q3' whose base is connected to the collector of the transistor Q1'. The transistors Q1' and Q2', the resistor R1', and the constant current circuit IS1' form an emitter-coupled logic (ECL) gate.

The address buffer 4' includes a plurality of the address buffer units $4_1'$ to $4_m'$ provided for every address signal of the input word address signals. As a typical construction, the address buffer unit $4_1'$ provided for an address signal A1 of the input word address signals, includes two transistors Q7' and Q8', whose emitters are commonly connected, a constant current circuit IS3', two load resistors R3' and R4', a transistor Q9' and constant current circuit IS4' forming an input emitter follower circuit, and a transistor Q10' and a constant current circuit IS5' forming an emitter follower circuit to which the reference voltage VRF2 is applied. Further, the word decoder 3' includes two multi-emitter transistors Q11' and Q12', which receive the output signal from the address buffer unit $4_1'$, a decoder line 31' including a plurality of signal lines, to which each emitter of the multi-emitter transistors are connected, and four constant current circuits IS6', IS7', IS8' and IS9', connected between each signal line of the decoder line 31' and the low voltage power supply $V_{ee}$, respectively. The address buffer units, such as $4_1'$, are provided for every address signal of the word address signals. The outputs are suitably connected to each signal line of the decoder line 31' via two multi-emitter transistors, respectively. Further, signal lines of the decoder line 31' are connected to the input terminals of the word driver units $2_1'$ to $2_n'$, respectively.

The redundancy memory cell array 10 has a plurality of memory cells connected between a high voltage redundancy word line WL(R)+ and a low voltage redundancy word line WL(R)− and between a pair of bit lines BL and $\overline{BL}$ common to the memory cell array 1. The redundancy word driver 6' has the same construction as the word driver units of the word driver 2' and includes transistors Q20', Q21', and Q22', a resistor R8', and a constant current circuit IS14'. A reference voltage VRF5' is applied to the base of the transistor Q21'.

The comparator circuit 5 includes a plurality of comparison gate units $5_1$ to $5_m$ provided for every address signal of the word address signals. As a typical construction, the comparison gate unit $5_1$ includes transistors Q13 to Q19, constant current circuits IS10 to IS13, a diode D1, and resistors R5, R6, and R7. The transistor Q13, the diode D1, and the constant current circuit IS10 form an input emitter follower circuit. The commonly-connected emitters of the transistors Q14 and Q15 are connected to the low voltage power supply $V_{ee}$ via the constant current circuit IS11. The commonly-connected emitters of the transistors Q16 and Q17 are also connected to the low voltage power supply $V_{ee}$ via the constant current circuit IS12. Further, the reference voltage VRF3 and VRF4 are applied to the bases of the transistors Q15 and Q16, respectively, and the output signal of the PROM, corresponding to one address signal of the defective address, is applied to the base of the transistor Q17. The collectors of the transistors Q14 and Q16 are connected together to the base of the transistor Q19. Also, the collectors of the transistors Q15 and Q17 are connected together to the base of the transistor Q18. The transistors Q18 and Q19 and the constant current circuit IS13 form a logical add (OR) circuit, and the output signals of the comparison gate units $5_l$ to $5_m$, i.e., the selection signal SR, are input to the reference voltage terminals of the word driver units $2_1'$ to $2_n'$ of the word driver 2', i.e., the bases of the transistors Q2', Q5', etc., and the input terminal of the redundancy word driver 6', i.e., the base of the transistor Q20'.

The mode of operation of the above-described embodiment will now be described. First, the read and write operations in the normal state will be described. In this case, the word address signals are applied to the word address buffer 4', (i.e., the address signal A1 is applied to the buffer unit $4_1'$, for example), while the bit address is applied to the bit address buffer (not shown). Each of the address buffer units $4_1'$ to $4_m'$ outputs a high level or low level signal to a signal line of the decoder line 31' via the multi-emitter transistors Q11' and Q12', etc., in accordance with the level of each address signal of the word address signals. The signal lines of the decoder line 31' are connected to the plural number of multi-emitter transistors. If one or more of the output signals of the multi-emitter transistors is high level, the voltage level of the signal line becomes high level. When, for example, the signal line connected to the base of the input transistor Q1' of the word driver unit $2_1'$ becomes low level, the word driver unit $2_1'$ outputs a high level word line selection signal to the high voltage word line WL+, whereby the word line is selected. Further, a pair of bit lines BL and $\overline{BL}$ are selected by the bit decoder, etc. (not shown). Thus, the read and write operations of data for the memory cell MC connected to the word line and a pair of the bit lines selected as described above are carried out.

The mode of operation of the redundancy circuit portion will now be described.

The comparison gate unit 51 forms an exclusive OR circuit. Therefore, if the word address signal (in this case, the address signal A1), input to the unit 51 and the defective address signal supplied from the PROM to the unit 51 are both high level or both low level, the unit 51 outputs a low level selection signal SR. On the other hand, if one of these signals is high level while the other is low level, the unit 51 outputs a high level selection signal SR.

In more detail, when the word address signal A1 is high level, the transistor Q14 becomes ON while the transistor Q15 becomes OFF, whereby the base voltage of the output transistor Q19 becomes low level. At this time, if the defective word address signal output from the PROM to the base of the transistor Q17 is high level, the transistor Q17 becomes ON while the transistor Q16 becomes OFF, whereby the base voltage of the output transistor Q18 becomes low level. As a result, the selection signal SR becomes low level.

When the word address signal A1 is high level and the defective word address signal is low level, the transistor Q17 becomes OFF and the transistor Q16 becomes ON. Thus, the base voltage of the output transistor Q19 becomes low level and the base voltage of the output transistor Q18 becomes high level. Accordingly, the selection signal SR becomes high level.

When the word address signal A1 is low level, the transistor Q14 becomes OFF and the transistor Q15 becomes ON. Thus, the base voltage of the output transistor Q18 becomes low level. At this time, if the defective word address signal is low level, the transistor Q17 becomes OFF and the transistor Q16 becomes ON, whereby the base voltage of the output transistor Q19 becomes low level so that the selection signal SR becomes low level.

When the word address signal A1 is low level and the defective word address signal is high level, the base voltage of the output transistor Q18 becomes low level while the base voltage of the output transistor Q19 becomes high level. Thus, the selection signal SR becomes high level. Thus, each of the comparison gate units 5l to 5m executes an exclusive logical add operation on each of the word address signals and each of the defective word address signals from the PROM.

Figure 2:
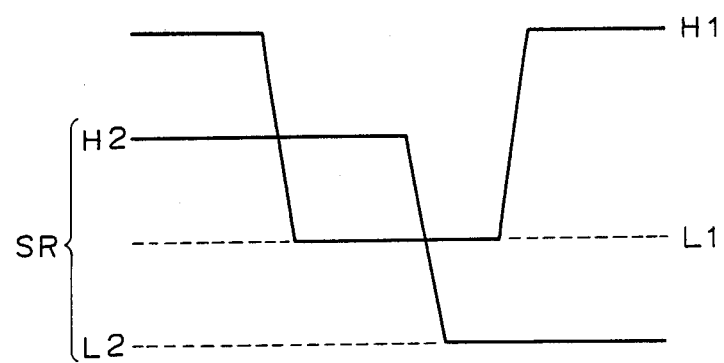
FIG. 2 is a graph of voltage levels of signals at various portions in the device of FIG. 1.

FIG. 2 is a signal diagram of the relationship between the signal level of the selection signal SR output from the comparator circuit 5 and the signal level of the input signal to the word driver. In FIG. 2, H1 and L1 indicate high and low logical levels of the input signal to the word driver 2', respectively. H2 and L2 indicate high and low levels of the selection signal SR, respectively. As is clear from FIG. 2, the high and low levels H2 and L2 of the selection signal SR are shifted toward the low voltage side in comparison with the high and low levels H1 and L1 of the input signal. That is, the high level H2 of the selection signal SR is between the high and low levels H1 and L1 of the input signal, and the low level L2 is lower than the low level L1. Further, the reference voltage VRF5' applied to the base of the transistor Q21' is between the high voltage level H2 and the low voltage level L2 of the selection signal SR.

In the circuit of FIG. 1, when the input word address signals do not coincide with a defective word address stored in the PROM, and when the selection signal SR is high level H2, the output signal of the redundancy word driver 6' becomes low level thus the high voltage redundancy word line WL(R)+ of the redundancy memory cell array 10 becomes low level and the redundancy memory cell array 10 enters a non-selection state. In this case, the selection signal SR is utilized as the reference voltage of each word driver unit of the word driver 2', and the read and write operations of the data described before are carried out.

On the other hand, when the input word address signals coincide with the defective word address stored in the PROM, all output signals of the comparison gate units 5l to 5m, corresponding to every address signal of the word address signals, become entirely low level. Thus, the selection signal SR becomes low level. In this case, the low voltage level L2 of the selection signal SR becomes lower than the low voltage level L1 of the logical signal input to each word driver unit of the word driver 2', as described above. Accordingly, when the word address signals indicate a defective circuit portion, the selection signal SR becomes the lowest voltage level L2. Thus, the transistors Q2' and Q5', etc., of each word driver unit become OFF while the transistors Q1' and Q4', etc. become ON, so that the voltages of all high voltage word lines WL+ become low level, i.e., the non-selection level. At this time, in the redundancy word driver 6', the transistor Q20' becomes OFF while the transistor Q21' becomes ON. Thus, the redundancy word line WL(R)+ becomes high level and the redundancy memory cell array 10 is selected. In such a manner, the redundancy memory cell array 10 is accessed in place of the defective word address portion of the memory cell array 1.

In addition, when the word address signals do not coincide with the defective word address stored in the PROM, the selection signal SR becomes high level H2, as described above, the output signal of the redundancy word driver 6' then becomes low level and the redundancy memory cell array 10 enters the non-selection state.

Thus, it is possible to provide a bipolar-transistor type semiconductor memory device having a logic type decoder wherein a defective circuit portion can be replaced by a redundancy circuit portion. However, as above-mentioned, a bipolar-transistor type semiconductor memory device having both a diode matrix type decoder and a redundancy configuration has not been provided as yet.

The present invention has been developed to provide a bipolar transistor type semiconductor memory device having a diode matrix type decoder and a redundancy configuration. In order to clarify the feature of the present invention, an example of a conventional memory device having a diode matrix type decoder will now be described by referring to FIG. 3, before explaining the preferred embodiments of the present invention.

Figures 3, 3A:
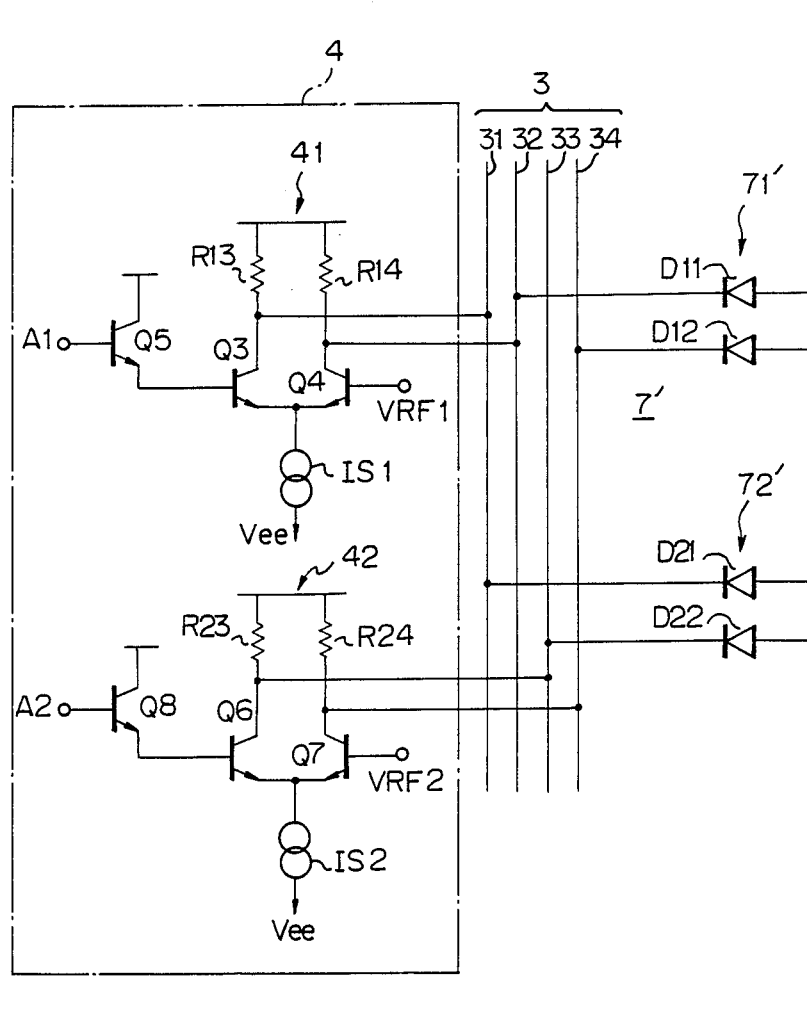
FIG. 3 which includes
FIGS. 3A and 3B is a circuit diagram of a conventional semiconductor memory device having the diode matrix type decoder.
Figure 3B:
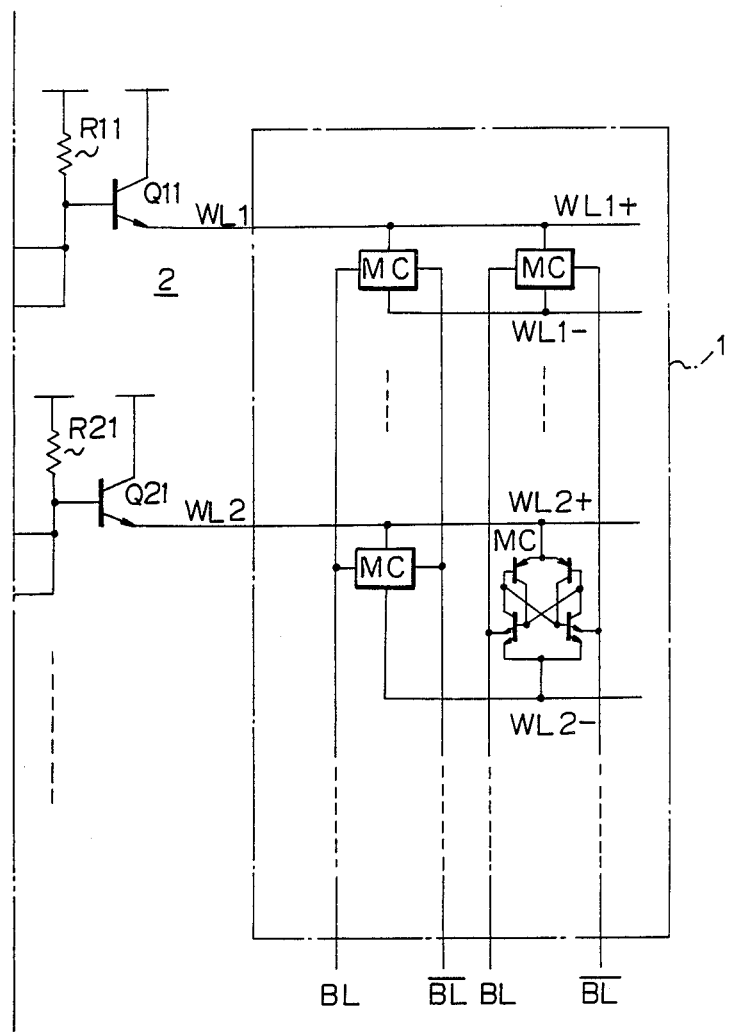

FIG. 3 is a conventional memory device having a diode matrix type decoder, which does not include a redundancy configuration. In FIG. 3, reference numeral 4 is an address buffer circuit including a predetermined number of address buffer units 41, 42, and so on. The number of units corresponds to the number of address signals of the input address signals.

In order to simplify the explanation, in the memory device shown in FIG. 3, only two word address signals A1 and A2 are input as the address signals to the address buffer circuit 4, i.e., each the address signals A1 and A2 is input to each of the address buffer units 41 and 42. Each of the address buffer units 41 and 42 includes an emitter-coupled logic gate (ECL gate circuit). The address buffer unit 41 includes a pair of transistors Q3 and Q4 whose emitters are connected in common. The address signal A1 is supplied to a base of the transistor Q3 through a base and an emitter of a transistor Q5. A predetermined high potential (for example, an earth potential) is supplied to a collector of the transistor Q5. Also, a predetermined reference voltage VRF1 is supplied to a base of the transistor Q4. Further, a pair of resistors R13 and R14 are connected between each of the collectors of the transistors Q3 and Q4 and the predetermined high potential (for example, an earth potential), respectively, and a constant current source IS1 is connected between the common connected emitters of the transistors Q3 and Q4 and a predetermined low potential $V_{ee}$ (for example, a predetermined negative potential).

Similarly, the address buffer unit 42 includes a pair of transistors Q6 and Q7 whose emitters are connected in common. The address signal A2 is supplied to a base of the transistor Q6 through a base and an emitter of the transistor Q8. The above predetermined high potential is supplied to a collector of the transistor Q8. Also, a predetermined reference voltage VRF2 is supplied to a base of the transistor Q7. Further, a pair of resistors R23 and R24 are connected between each of collectors of the transistors Q6 and Q7 and the predetermined high potential, respectively, and a constant current source IS2 is connected between the common connected emitters of the transistors Q6 and Q7 and the predetermined low potential $V_{ee}$. Although, in the address buffer circuit 4 shown in FIG. 3, only two address buffer units 41 and 42 are provided to receive only two word address signals A1 and A2, it is possible to freely determine the number of the address buffer units in accordance with the number of the input address signals.

Reference number 3 shows a decoder line including a plurality of signal lines (in this case, four signal lines 31 to 34). As shown in FIG. 3, each collector of the transistors Q3 and Q4 provided in the address buffer unit 41 is respectively connected to the signal lines 31 and 32, and each collector of the transistors Q6 and Q7 provided in the address buffer unit 42 is respectively connected to the signal lines 33 and 34.

Reference numeral 2 shows a word driver including a plurality of drive transistors Q11, Q21, and so on. The number of the drive transistors is four when only two address signals A1 and A2 are input to the address buffer circuit 4. In FIG. 3, only two drive transistors Q11 and Q21 are shown.

A collector and an emitter of the drive transistor Q11 are connected to a predetermined high potential (earth potential, for example) and the emitter is connected to a word line WL1 provided in a memory cell array 1. Also, a base of the transistor Q11 is connected to the above predetermined high potential through a resistor R11. Similarly, a collector and an emitter of the transistor Q21 are connected to the predetermined high potential and the emitter is connected to a word line WL2 provided in a memory cell array 1. Also, a base of the transistor Q21 is connected to the above predetermined high potential through a resistor R21. The remaining two drive transistors (not shown in FIG. 3) are also similarly constructed.

Reference numeral 7' shows a diode matrix type decoder including a predetermined number of diode groups 71', 72', and so on. In the above case, the number of the diode groups is four, but in FIG. 3, only two diode groups 71' and 72' are shown. The diode group 71' comprises two diodes D11 and D12, each of which is connected between each of the signal lines 32, 34 and the base of the transistor Q11. Also, the diode group 72' comprises two diodes D21 and D22, each of which is connected between each of the signal lines 31, and 33 and the base of the transistor Q21. The remaining two diode groups (not shown in FIG. 3) also include two diodes, each of which is connected between each of the predetermined signal lines and the base of the corresponding drive transistor, respectively.

The construction of the memory cell array 1 is the same as that shown in FIG. 1. In the above case, the number of the word lines is four, and each of the four word lines (in FIG. 3, only two word lines WL1 and WL2 are shown) is connected to an emitter of the corresponding drive transistor.

The operation of the memory device shown in FIG. 3 will now be explained. When the voltage levels of the input address signals A1 and A2 are both high, the transistors Q3 and Q6 are supplied with the corresponding address signals A1 and A2 through their bases and turn ON. On the other hand, the transistors Q4 and Q7 are supplied with the corresponding reference voltages VRF1 and VRF2 through their bases and turn OFF. Thus, the voltage levels of the signal lines 31 and 33, connected to the corresponding collectors of the transistors Q3 and Q6, become low. On the other hand, the voltage levels of the signal lines 32 and 34, connected to the corresponding collectors of the transistors Q4 and Q7 become high.

No current flows through the diodes D11 and D12 connected to the corresponding signal lines 32 and 34 having high voltage levels, and the voltage level of the base of the drive transistor Q11 becomes high. Therefore the voltage level of the emitter of the drive transistor Q11 becomes nearly equal to that of its emitter (that is, a high level), and the word line WL1 connected to the emitter of the transistor Q11 is selected.

At this time, a predetermined current flows through the diodes D21 and D22 connected to the corresponding signal lines 31 and 33 having low voltage levels. Thus, the voltage level of the base of the drive transistor Q21 becomes low due to the voltage drop produced through the resistor R21. Therefore, the voltage level of the emitter of the drive transistor Q21 also becomes low level, and the word line WL2 connected to the emitter of the transistor Q21 is non-selected.

When the voltage levels of the input address signals A1 and A2 are both high, as above-mentioned, a predetermined current also flows through at least one of the two diodes provided in each of the remaining diode groups (in this case, two remaining diode groups). Thus the voltage levels of the bases of the remaining two drive transistors (not shown) all become low due to the voltage drop produced through the corresponding resistors. Therefore, the voltage levels of the emitters of the remaining drive transistors also become low, and the remaining word lines (in this case, two remaining word lines), each of which is connected to the emitter of the corresponding drive transistors, are all non-selected.

As above-mentioned, in a conventional memory device having a diode-matrix type decoder, a redundancy configuration is not provided, as shown in FIG. 3. Contrary to this, according to the present invention, there is provided a memory device having a diode matrix type decoder and a redundancy configuration by adding only a relatively simple circuit.

Figure 4A:
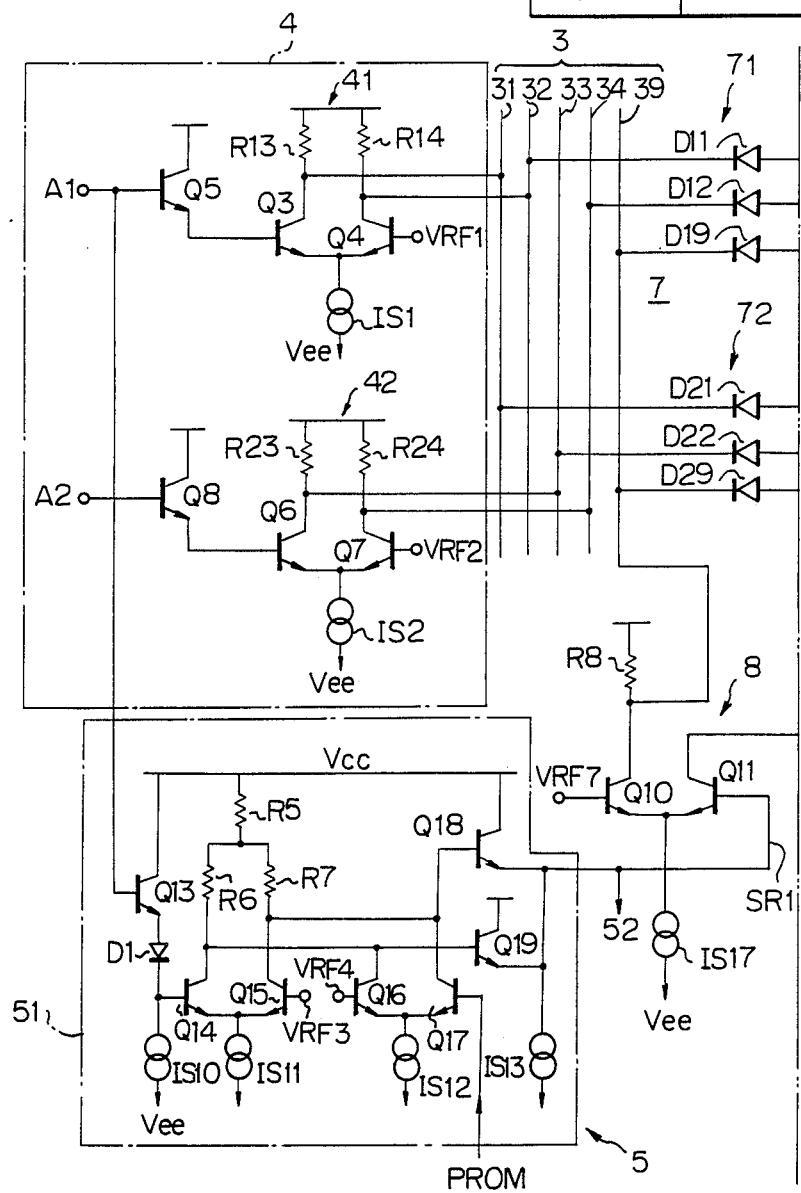
FIGS. 4A and 4B, is a circuit diagram of a semiconductor memory device having a diode matrix type decoder and redundancy configuration according to a first embodiment of the present invention.
Figure 4B:
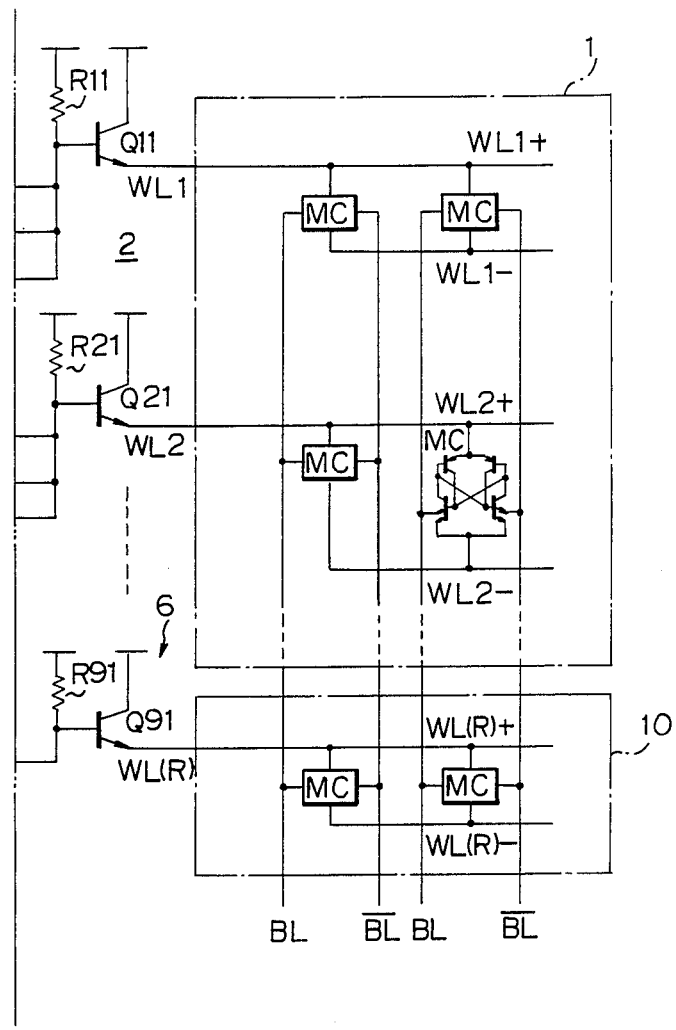

FIG. 4 is a circuit diagram of a semiconductor memory device having a diode matrix type decoder and a redundancy configuration, according to a first embodiment of the present invention. In FIG. 4, members identical to those of FIG. 3 are represented by the same reference numerals or characters (as in all later figures).

Thus, the construction of the address buffer circuit 4 is the same as that shown in FIG. 3, and in a usual operation state, a predetermined word line provided in the memory cell array 1 (in this case, one of four word lines, but only two word lines WL1 and WL2 are shown in FIG. 4) is selected in accordance with the voltage levels of the two input word address signals A1 and A2.

The construction of the comparator circuit 5 is also the same as that shown in FIG. 1, and in this case, the comparator circuit 5 includes two comparison gate units 51 and 52. As above-mentioned, the comparison gate unit 51 compares the voltage level of the input address signal A1 with the voltage level of the corresponding defective address signal supplied from the PROM to the unit 51. The voltage level of the output signal of the unit 51 becomes low when the voltage levels of the address signal A1 and the above corresponding defective address signal coincide. The voltage level of the output signal of the unit 51 becomes high when the voltage levels of these signals do not coincide. Similarly, the voltage level of the output signal of the unit 52 becomes low when the voltage levels of the address signal A2 and the corresponding defective address signal supplied from the PROM to the unit 52 coincide. The voltage level of the output signal of the unit 52 becomes high when the voltage levels of these signals do not coincide. Thus, the voltage level of a selection signal SRI output from the comparator circuit 5 becomes low when each voltage level of the input word address signals A1 and A2 coincides with each voltage level of address signals corresponding to the defective address supplied from the PROM to each of the units 51 and 52. The voltage level of the selection signal SRI becomes high when at least one voltage level of the input word address signals does not coincide with each voltage level of address signals corresponding to the defective address supplied from the PROM.

Reference numeral 8 is a switching circuit including a pair of transistors Q10 and Q11, each of which is supplied with a reference voltage VRF7 and the selection signal SRI through a corresponding base. A resistor R8 is connected between a collector of the transistor Q10 and a predetermined high potential (for example, an earth potential). A constant current source IS17 is connected between common connected emitters of the transistors Q10 and Q11 and a predetermined low potential $V_{ee}$ (a predetermined negative potential, for example). Also, a resistor R91 is connected between a collector of the transistor Q11 and a predetermined high potential (for example, an earth potential). The collector of the transistor Q11 is also connected to a base of the drive transistor Q91, and a collector and an emitter of the drive transistor Q91 are connected to the predetermined high potential and a word line WL(R) provided in a redundancy memory cell array 10, respectively. Further, in the device shown in FIG. 4, a signal line 39 connected to the collector of the transistor Q10 is provided next to the signal lines 31 to 34 shown in FIG. 3, a diode D19 is connected between the base of the drive transistor Q11 and the signal line 39, and a diode D29 is connected between the base of the drive transistor Q21 and the signal line 39. Similarly, there are provided diodes, each of which is connected between the base of each of the remaining two drive transistors and the signal line 39 (not shown in FIG. 4). Thus, in a diode matrix decoder 7, a diode group 71 comprises three diodes D11, D12, and D19, and a diode group 72 comprises three diodes D21, D22, and D29. Reference numeral 6 is a redundancy word driver including a redundancy drive transistor Q91.

When the voltage level of the selection signal SRI supplied to the gate of the transistor Q11 becomes low, (namely, when each voltage level of the input address signals A1 and A2 coincides with each voltage level of address signals corresponding to the defective address supplied from the PROM to the comparator circuit 5), the transistor Q11 turns OFF, and the transistor Q10 supplied with a reference voltage VRF7 through its base turns ON. Therefore, the voltage level of the signal line 39 connected to the collector of the transistor Q10 becomes low due to the voltage drop produced through the resistor R8. A predetermined current flows through the diodes D19, D29, and so on, each of which is connected between the base of the corresponding drive transistor and the signal line 39. Therefore, the voltage levels of the base and emitter of all drive transistors Q11, Q21, etc., each of which is connected to corresponding word lines WL1, WL2, etc. provided in the memory cell array 1 through its emitter, are made low level. Therefore, all word lines provided in the memory cell array 1 including a word line connected to a defective memory cell existing in the memory cell array 1 are non-selected, even when the input address signals coincide with the defective address corresponding to the defective memory cell stored in the PROM.

At this time, as the transistor Q11 turns OFF as above-mentioned, the voltage levels of the base of the drive transistor Q91 connected to the collector of the transistor Q11 and the emitter of the drive transistor Q91 become high, and thus the voltage level of the redundancy word line WL(R) provided in the redundancy memory cell array 10 also becomes high. Therefore the redundancy word line WL(R) is selected.

Contrary to this, when the voltage level of the selection signal SRI becomes high, that is, when at least one voltage level of the input address signals does not coincide with each voltage level of address signals corresponding to the defective address supplied from the PROM to the comparator circuit 5), the transistor Q11 turns ON, and the transistor Q10 turns OFF. Therefore, the voltage level of the signal line 39 connected to the collector of the transistor Q10 becomes high, and a current does not flow through the diodes D19, D29, etc., each of which is connected between the base of the corresponding drive transistor and the signal line 39. The diode matrix type decoder 7 performs the same operation as the decoder 7' shown in FIG. 3, and accordingly, when the voltage levels of the input address signals A1 and A2 are, for example, both high, the word line WL1 provided in the memory cell array 1 is selected. At this time, as the transistor Q11 turns ON, the voltage levels of the base and the emitter of the drive transistor Q91 become low due to the voltage drop generated through the resistor R91. Thus the redundancy word line WL(R) provided in the redundancy memory cell array 10 is non-selected.

In the above embodiment, the voltage level of the selection signal SRI becomes low when each voltage level of the input address signals coincides with each voltage level of the defective address signals output from the PROM. It is also possible to set the voltage level of the selection signal SRI to high level by switching the connection of each collector of the transistors Q10 and Q11.

Figure 5A:
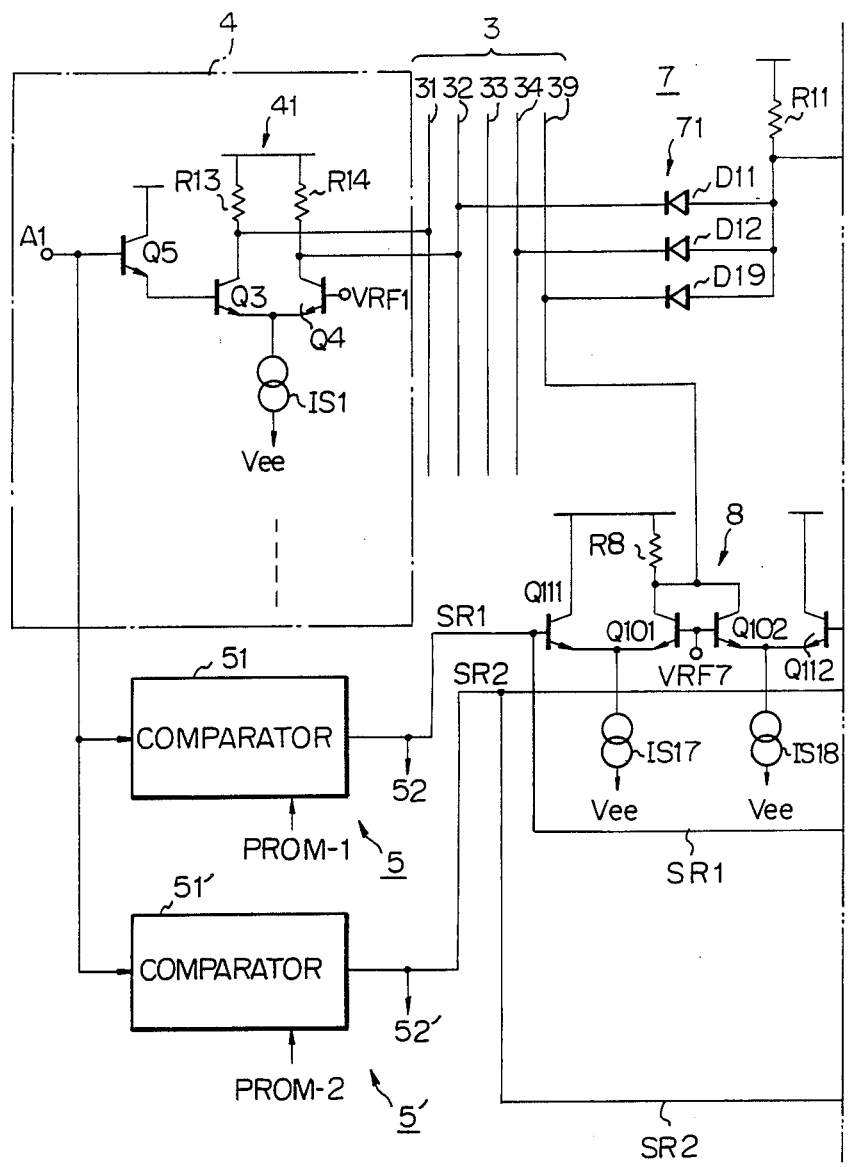
FIGS. 5A and 5B, is a circuit diagram of a semiconductor memory device having a diode matrix type decoder and redundancy configuration according to a second embodiment of the present invention.
Figure 5B:
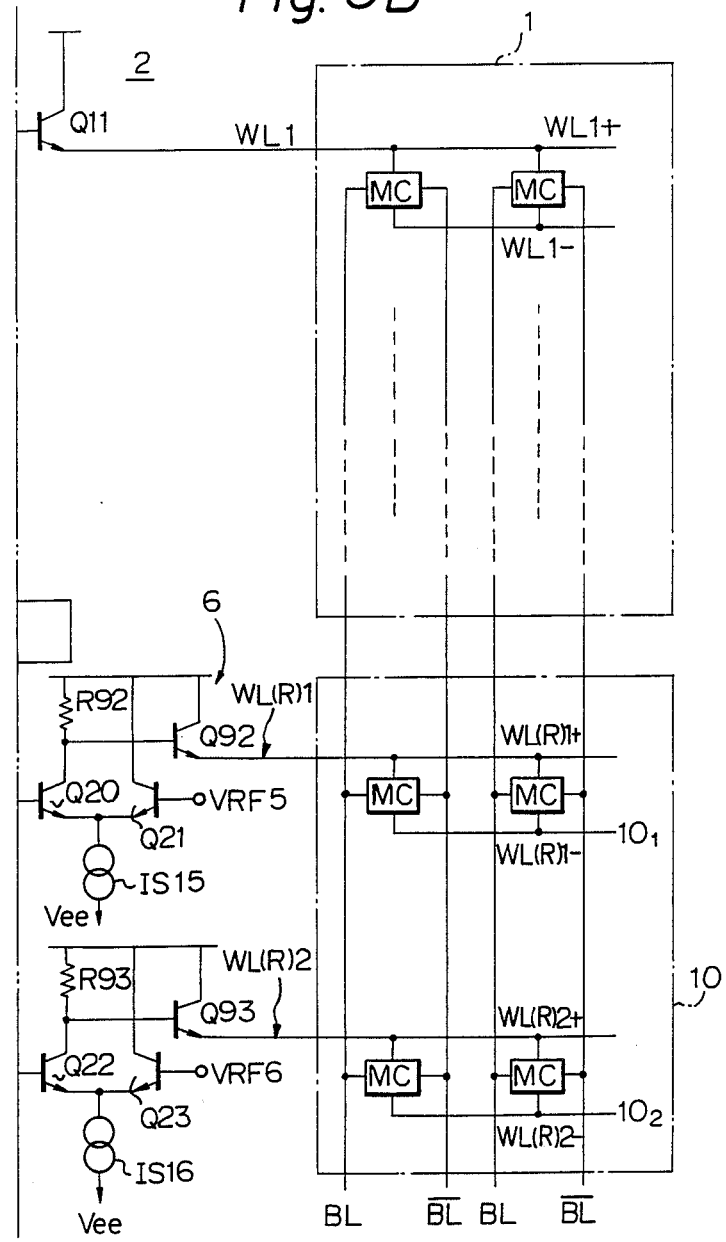

FIG. 5 is a circuit diagram of a semiconductor memory device according to a second embodiment of the present invention. In the device shown in FIG. 5, the redundancy memory cell array 10 comprises two redundancy memory cell units $10_1$ and $10_2$, each of which is connected to each of two redundancy word lines WL(R)1 and WL(R)2.

Although the constructions of the address buffer circuit 4 and the diode matrix type decoder 7 are the same as those shown in FIG. 4, the address buffer unit 42 and the diode group 72, and the corresponding drive transistor and word line are not shown in FIG. 5.

Also, in the device shown in FIG. 5, there are provided two sets of comparator circuits 5 and 5', and the construction and operation of the comparator circuits 5 and 5' is the same as that of the comparator circuits shown in FIG. 4. In this case, each of the comparator circuits 5 and 5' includes each of two comparison gate units 51, 52 and 51', 52'.

Thus, the voltage level of a selection signal SR1 output from the comparator circuit 5 becomes low when each voltage level of the input word address signals (in this case, the signals A1 and A2) coincides with each voltage level of address signals corresponding to a defective address supplied from a PROM-1. The voltage level of the selection signal SRI becomes high when at least one of the voltage levels of the input word address signals does not coincide with each voltage level of the address signals corresponding to the defective address supplied from the PROM-1.

Also, the voltage level of a selection signal SR2 output from the comparator circuit 5' becomes low when each voltage level of the input word address signals coincides with each voltage level of address signals corresponding to another defective address supplied from a PROM-2. The voltage level of the selection signal SR2 becomes high when at least one of the voltage levels of the input word address signals does not coincide with each voltage level of address signals corresponding to the other defective address supplied from the PROM-2.

Further, in FIG. 5, a switching circuit 8 includes a first set of transistor pairs Q101, Q111, and Q102, Q112, a second set of transistor pairs Q20, Q21, and Q22, Q23, and a redundancy word driver 6 including two transistors Q92 and Q93. The operations of these transistors is described below.

When the voltage level of the selection signal SRI supplied to a gate of the transistor Q111 becomes low (that is, when each voltage level of the input address signals coincides with each voltage level of address signals corresponding to the defective address supplied from the PROM-1), the transistor Q111 turns OFF, and the transistor Q101 being supplied with a reference voltage VRF7 through its base turns ON. Therefore, the voltage level of the signal line 39 connected to the collector of the transistor Q101 becomes low due to the voltage drop produced through the resistor R8. A predetermined current, then flows through the diode D19, etc., each of which is connected between the base of the corresponding drive transistor and the signal line 39. Therefore, the voltage levels of the base and emitter of all drive transistors Q11, etc., each of which has an emitter connected to corresponding word lines WL1, etc. provided in the memory cell array 1, are made low level. Therefore, all word lines provided in the memory cell array 1, including a word line connected to a defective memory cell existing in the memory cell array 1, are non-selected.

Simultaneously, as the selection signal SRI having a low voltage level is supplied to a gate of the transistor Q20, the transistor Q20 turns OFF, and the transistor Q21 is supplied with a reference voltage VRF5 through its base turns ON. Therefore, the voltage levels of a base (connected to a collector of the transistor Q20) and an emitter of the drive transistor Q92 become high. The voltage level of a redundancy word line WL(R)1 provided in the redundancy memory cell unit $10_1$ also becomes high, and as a result, the redundancy word line WL(R)1 is selected.

Similarly, when the voltage level of the selection signal SR2 supplied to a gate of the transistor 112 becomes low (namely, when each voltage level of the input address signals coincides with each voltage level of address signals corresponding to the other defective address supplied from the PROM-2), the transistor Q112 turns OFF. The transistor Q102, supplied with a reference voltage VRF7 through its base, turns ON. Therefore, the voltage level of the signal line 39 connected to the collector of the transistor Q102 becomes low due to the voltage drop produced through the resistor R8. Thus a predetermined current flows through the diode D19, etc., each of which is connected between the base of the corresponding drive transistor and the signal line 39. As above-mentioned, all word lines provided in the memory cell array 1 including a word line connected to a defective memory cell existing in the memory cell array 1 are non-selected.

Simultaneously, as the selection signal SR2 having low voltage level is supplied to a gate of the transistor Q22, the transistor Q22 turns OFF, and the transistor Q23, supplied with a reference voltage VRF6 through its base, turns ON. Therefore, the voltage levels of a base (connected to a collector of the transistor Q22) and an emitter of the drive transistor Q93 become high. The voltage level of a redundancy word line WL(R)2 provided in the redundancy memory cell unit $10_2$ also becomes high, and as a result, the redundancy word line WL(R) 2 is selected. In this connection, reference numerals IS15 and IS16 are both constant current sources connected between common connected emitters of corresponding transistors and the predetermined low potential $V_{ee}$.

Contrary to this, when the voltage levels of the selection signals SR1 and SR2 are both high, that is, when at least one voltage level of the input address signals neither coincides with the voltage level of the corresponding address signal supplied from the PROM-1 nor with the voltage level of the corresponding address signal supplied from the PROM-2), both transistors Q111 and Q112 turn ON, and both transistors Q101 and Q102 turn OFF. The voltage level of the signal line 39 becomes high, and accordingly, current does not flow through the diodes D19, etc., each of which is connected between the base of the corresponding drive transistor and the signal line 39. Accordingly, if the voltage levels of the input address signals A1 and A2 (the signal A1 is shown only in FIG. 5) are, for example, both high, the word line WL1 is selected by the same operation as described referring to FIG. 4. At this time, as the selection signals SR1 and SR2 having high voltage levels are supplied to the bases of the transistors Q20 and Q22, respectively, both transistors Q20 and Q22 turn ON. Thus, the voltage levels of the base (connected to the collector of the transistor Q20) and the emitter of the transistor Q92 become low due to the voltage drop produced through a resistor R92. Similarly, the voltage levels of the base (connected to the collector of the transistor Q22) and the emitter of the transistor Q93 become low due to the voltage drop produced through a resistor R93. As a result, the voltage levels of both redundancy word lines WL(R) 1 and WL(R) 2 become low, and the redundancy word lines WL(R) 1 and WL(R) 2 are both non-selected.

Figure 6A:
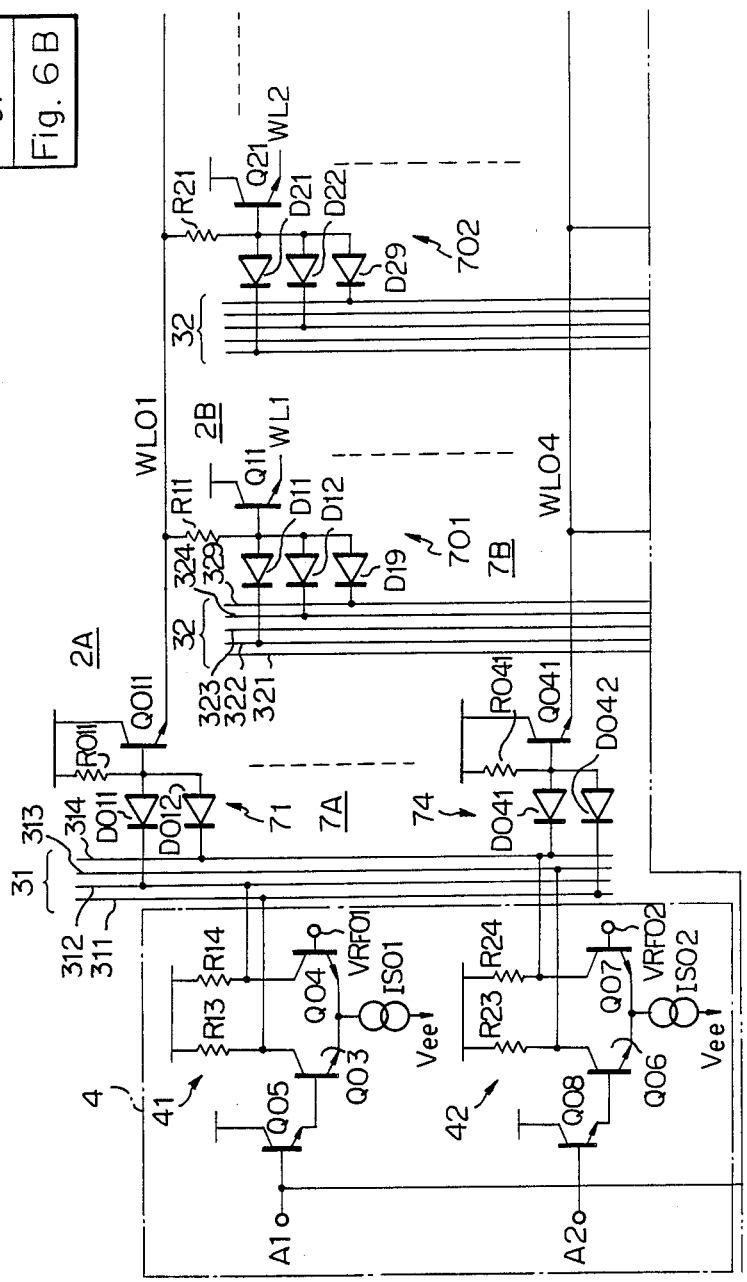
FIGS. 6A and 6B, is a circuit diagram of a semiconductor memory device having a diode matrix type decoder and redundancy configuration according to a third embodiment of the present invention.
Figure 6B:
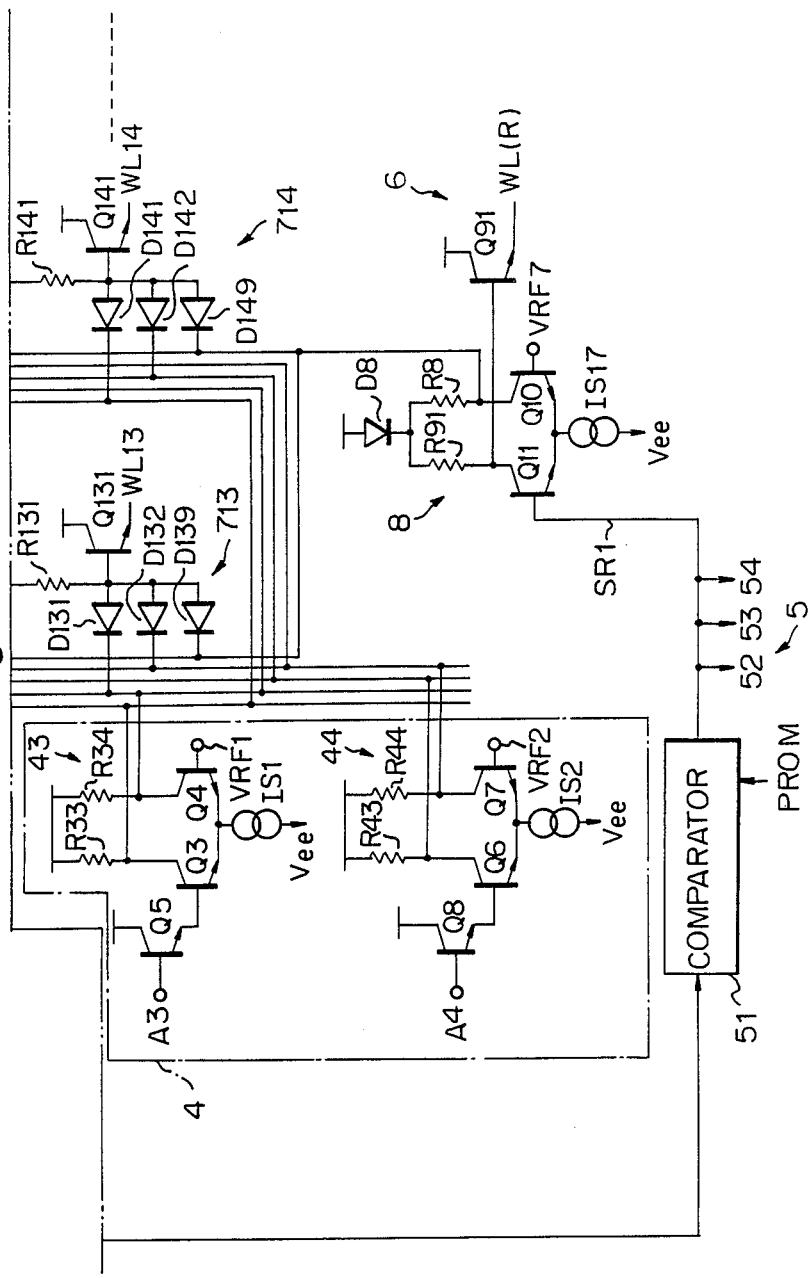

FIG. 6 is a circuit diagram of a semiconductor memory device according to a third embodiment of the present invention. In the device shown in FIG. 6, the diode matrix type decoder is constructed in two stages, as shown by reference numerals 7A and 7B. The address buffer circuit 4 comprises four address buffer units 41 to 44, to which the input address signals A1 to A4 are supplied, respectively.

The construction and operation of the address buffer units 41 and 42, a decoding line 31 including four signal lines 311 to 314, a diode matrix decoder 7A including the diode groups 71 to 74, and a word driver 2A including four drive transistors Q011 to Q041 are the same as those of the address buffer units 41 and 42, the decoding line 3 including four signal lines 31 to 34, the diode matrix decoder 7' including the diode groups 71', 72' etc., and the word driver 2 including the drive transistors Q11, Q21, etc., shown in FIG. 3, respectively.

One of four word lines WL01 to WL04 is primarily selected in accordance with the voltage levels of the input address signals A1 and A2. When the voltage levels of the input address signals A1 and A2 are both high, the voltage level of the word line WL01 becomes high, and accordingly, the word line WL01 is primarily selected by the same operation as described referring to FIG. 3.

In addition, the construction and operation of the address buffer units 43 and 44, a decoding line 32 including five signal lines 321 to 324 and 329, a diode matrix decoder 7B including a predetermined number of diode groups (for example, 701), and a word driver 2B including a predetermined number of driver transistors (for example, Q11) are the same as those of the address buffer units 41 and 42, a decoding line 3 including five signal lines 31 to 34 and 39, the diode matrix decoder 7 including the diode groups (for example, 71), and the word driver 2 including the drive transistors (for example, Q11), shown in FIG. 4, respectively.

Therefore, one of sixteen word lines WL1 to WL16 (among these word lines, only the word lines WL1, WL2, WL13, and WL14 are shown in FIG. 6) is finally selected in accordance with the voltage levels of the input address signals A1 to A4.

When the voltage levels of the input address signals A1 and A2 are both high, the voltage level of the word line WL01 becomes high as above-mentioned. At this time, if the voltage levels of both input address signals A3 and A4 are also high, the voltage level of the word line WL1 becomes high, and thus the word line WL1 is finally selected by the same operation (the operation performed when the voltage level of the selection signal SR1 is high) as described referring to FIG. 4.

Also, when the voltage level of the word line WL04 becomes high in accordance with the predetermined voltage levels of the input address signals A1 and A2, if the voltage levels of the input address signals A3 and A4 are both high, the voltage level of the word line WL13 becomes high. Thus the word line WL13 is finally selected as long as the voltage level of the selection signal SR1 is high. In this connection, the construction of the comparator circuit 5 is the same as that of the comparator circuit 5 shown in FIG. 4., except that the comparator circuit shown in FIG. 6 comprises four comparison gate units 51 to 54. Also, the construction of the switching circuit 8 and the redundancy word driver 6 is the same as those of the switching circuit 8 and the redundancy word decoder 6 shown in FIG. 4, except that the switching circuit 8 shown in FIG. 6 comprises a diode D8 to compensate for the voltage drop of the word lines (WL01, for example) produced by providing the drive transistors (for example, Q011).

When the voltage level of a selection signal SR1 output from the comparator circuit 5 becomes low that is, when each voltage level of the input word address signals (in this case, the signals A1 to A4) coincides with each voltage level of address signals corresponding to a defective address supplied from the PROM), all word lines connected to the memory cell array (in this case, sixteen word lines WL1, WL2, etc.) are non-selected, and the redundancy word line WL(R) connected to the redundancy memory cell array is selected.

Contrary to this, when the voltage level of the selection signal SR1 becomes high (that is, when at least one voltage level of the input word address signals does not coincide with the voltage level of the corresponding address signal supplied from the PROM), a predetermined word line from the above sixteen word lines is selected in accordance with the voltage levels of the input word address signals, and the redundancy word line WL(R) is non-selected.

Although, in the above embodiments, only two or four address signals (i.e., A1 and A2, or A1 to A4) are used as the input word address signals, it is possible to freely determine the number of the input word address signals and to increase the capacity of the memory device. If the number of the input word address signals is selected as eight (i.e., A1 to A8), it is possible to select one of two hundred and fifty six word lines in accordance with the voltage levels of the input word address signals.

Further, in the above embodiments, although only word address signals are used as the input address signals and only a predetermined word line or a predetermined redundancy word line is selected in accordance with the voltage levels of the input word address signals and the selection signal, it is also possible to use predetermined bit address signals as the input address signals. Therefore a predetermined bit line (or predetermined pair of bit lines BL and $\overline{BL}$) or a predetermined redundancy bit line (or predetermined pair of redundancy bit lines) connected to the redundancy memory cell array are selected in accordance with the voltage levels of the input bit address signals and the selection signal.

I claim:

1. A bipolar-transistor type semiconductor memory device having a redundancy configuration, comprising:
    a memory cell array;

a first redundancy memory cell array;

a first address buffer circuit including a predetermined number of first emitter-coupled logic gates having output terminals, a predetermined number of first input address signals being input to each of said logic gates, each of said logic gates comparing a voltage level of the corresponding first input address signal with a voltage level of a reference signal;

a group of first decoder lines, each of said first decoder lines, respectively, operatively connected to a predetermined one of said output terminals;

a first comparator circuit, operatively connected to said address buffer circuit, for detecting whether or not each of said first input address signals coincides with an address signal corresponding to a defective memory cell and outputting a first selection signal in accordance with a coincidence between said first input address signal and the address signal corresponding to said defective memory cell;

a switching circuit, having an output terminal and operatively connected to said first comparator circuit, for comparing a voltage level of said first selection signal with a voltage level of the reference signal;

a second decoder line operatively connected to said output terminal of said switching circuit; and a predetermined number of first diode groups operatively connected to said memory cell array each of said first diode groups comprising a predetermined number of first diodes and a second diode, said first diodes connected to said first decoder lines and said second diode connected to said second decoder line, the conductive state of each of said first diodes being determined by a voltage level on a predetermined one of said first decoder lines, the conductive state of said second diode being determined by a voltage level on said second decoder line, said memory cell array being selected by said predetermined number of first diode groups in accordance with said first input address signals when said first comparator circuit does not output said first selection signal, said first redundancy memory cell array being selected when said first comparator circuit does output said first selection signal, making said second diode conductive.

2. A bipolar-transistor type semiconductor memory device having a redundancy configuration according to claim 1, further comprising:

a second comparator circuit for detecting whether or not each of said first input address signals coincides with address signals corresponding to a second defective memory cell and for outputting a second selection signal in accordance with a coincidence between said first input address signals and address signals corresponding to said second defective memory cell, wherein said switching circuit compares a voltage level of said first and second selection signals with the reference signal; and a second redundancy memory cell array, operatively connected to said second comparator circuit, being selected when said second comparator circuit outputs said second selection signal.

3. A bipolar-transistor type semiconductor memory device having a redundancy configuration according to claim 1, further comprising:

a second address buffer circuit including:

a predetermined number of second emitter-coupled logic gates, each of said second emitter-coupled logic gates having an output terminal, for receiving a predetermined number of second input address signals;

a group of third decoder lines operatively connected to a respective output terminal provided in each of said second emitter-coupled logic gates; and a predetermined number of second diode groups connected to said first diode groups and said second address buffer circuit, each of said second diode groups comprising a predetermined number of diodes, the conductive state of each of said predetermined number of diodes being determined by a voltage level on predetermined ones of said group of third decoder lines, wherein said memory cell array is selected through said predetermined first and second diode groups of said first and second address buffer circuits in accordance with said first and second input address signals input to said first and second address buffer circuits when said first comparator circuit does not output said selection signal.

* * * * *

UNITED STATES PATENT AND TRADEMARK OFFICE
CERTIFICATE OF CORRECTION

PATENT NO. : 4,757,475
DATED : JULY 12, 1988
INVENTOR(S) : TOMOHARU AWAYA

It is certified that error appears in the above-identified patent and that said Letters Patent is hereby corrected as shown below:

FRONT PAGE [57] ABSTRACT, Col. 2, line 5, after "lines" insert --is--;
line 9, "puts" should be --outputs--.

Col. 5, line 11, "A1)," should be --A1)--.

Col. 6, line 7, level thus" should be --level. Thus,--;
line 42, "above, the" should be --above. The--.

Col. 8, line 12, "31," should be --31--.

Col. 14, line 24, "that" should be --(that--.

Signed and Sealed this

Eighth Day of November, 1988

Attest:

DONALD J. QUIGG

*Attesting Officer*     *Commissioner of Patents and Trademarks*